(12) United States Patent
McGee

(10) Patent No.: US 12,513,850 B2
(45) Date of Patent: Dec. 30, 2025

(54) ELECTRONIC COMPONENT RACKING SYSTEM AND METHOD

(71) Applicant: Douglas McGee, Los Angeles, CA (US)

(72) Inventor: Douglas McGee, Los Angeles, CA (US)

(*) Notice: Subject to any disclaimer, the term of this patent is extended or adjusted under 35 U.S.C. 154(b) by 12 days.

(21) Appl. No.: 18/809,279

(22) Filed: Aug. 19, 2024

(65) Prior Publication Data

US 2025/0063684 A1 Feb. 20, 2025

Related U.S. Application Data

(60) Provisional application No. 63/533,570, filed on Aug. 18, 2023.

(51) Int. Cl.
| | | |
|---|---|---|
| H05K 7/18 | (2006.01) | |
| A47F 5/02 | (2006.01) | |
| H05K 7/16 | (2006.01) | |
| A47B 87/02 | (2006.01) | |

(52) U.S. Cl.
CPC ............... *H05K 7/18* (2013.01); *A47F 5/02* (2013.01); *H05K 7/16* (2013.01); *A47B 87/0207* (2013.01)

(58) Field of Classification Search
CPC ........... H05K 7/16; H05K 7/18; H05K 7/183; H05K 7/186; H05K 7/1489; H05K 7/1488; A47B 47/0091; A47B 87/02; A47B 87/0207; A47B 87/0215; A47F 5/02; A47F 3/08
See application file for complete search history.

(56) References Cited

U.S. PATENT DOCUMENTS

| | | | | |
|---|---|---|---|---|
| 3,908,564 | A * | 9/1975 | Miller | A47F 5/13 108/162 |
| 3,912,087 | A * | 10/1975 | Zeischegg | A47B 87/007 403/171 |
| 4,155,311 | A * | 5/1979 | Jackovin | A47B 87/0207 211/199 |
| 4,202,029 | A | 5/1980 | Yoshikawa et al. | |
| 4,705,178 | A * | 11/1987 | Vail, Sr. | A47B 87/0207 211/126.9 |
| 4,718,858 | A | 1/1988 | Godfrey et al. | |
| 4,805,785 | A * | 2/1989 | Pfeifer | A47F 5/13 211/184 |
| 6,082,845 | A * | 7/2000 | Eizadkhah | H05K 7/16 312/223.1 |
| 6,971,529 | B1 * | 12/2005 | Shapiro | A47B 81/002 211/DIG. 1 |

(Continued)

FOREIGN PATENT DOCUMENTS

DE 2138375 A1 2/1973

*Primary Examiner* — Devin K Barnett
(74) *Attorney, Agent, or Firm* — Donn K. Harms

(57) ABSTRACT

A racking system allowing the pre-configuration and mounting of electronic equipment is provided thereby allowing for shipment of a plurality of rack assemblies having electronic components mounted and operatively wired therein, to be shipped to a remote venue. The support platforms for each of the plurality of rack assemblies may be engaged to each other to form a large support surface with electronic components already operatively positioned for use within the rack assemblies. Pathways are provided between the rack assemblies for access thereto.

15 Claims, 10 Drawing Sheets

(56) References Cited

U.S. PATENT DOCUMENTS

| | | | | |
|---|---|---|---|---|
| 8,379,410 B2* | 2/2013 | Kitten | H05K 7/1491 | 361/825 |
| 8,573,716 B2* | 11/2013 | Zalewski | A47B 47/0041 | 312/107 |
| 11,214,401 B1* | 1/2022 | Emmitt | B65D 19/385 | |
| 2005/0269917 A1* | 12/2005 | Ohayon | A47B 87/0207 | 312/108 |
| 2008/0078566 A1* | 4/2008 | Parker | H05K 7/18 | 174/50 |
| 2012/0062083 A1* | 3/2012 | Lewis, II | H05K 7/183 | 248/231.61 |
| 2012/0273436 A1* | 11/2012 | Qin | H05K 7/1497 | 211/26 |
| 2013/0091689 A1* | 4/2013 | Mimlitch, III | H05K 7/1488 | 29/525.01 |
| 2013/0170119 A1 | 7/2013 | Lai et al. | | |
| 2013/0213907 A1* | 8/2013 | Masse | H02B 1/01 | 211/26 |
| 2013/0249363 A1* | 9/2013 | Liu | H05K 7/18 | 312/265.1 |
| 2014/0177164 A1* | 6/2014 | Stewart | H05K 13/0486 | 211/26 |
| 2014/0190910 A1* | 7/2014 | Arflack | H05K 7/18 | 211/175 |
| 2015/0144578 A1* | 5/2015 | Maiden | A47B 47/025 | 211/26 |
| 2015/0316964 A1* | 11/2015 | Albert | H05K 7/18 | 211/41.12 |
| 2016/0073547 A1* | 3/2016 | Maloney | H05K 7/183 | 211/26 |
| 2016/0081472 A1* | 3/2016 | Aleisa | A47B 47/0091 | 211/188 |
| 2016/0128221 A1* | 5/2016 | Butterbaugh | H05K 7/1492 | 211/189 |
| 2017/0127555 A1* | 5/2017 | Anderson | H02B 1/012 | |
| 2018/0332962 A1* | 11/2018 | Pappas | H05K 7/1401 | |
| 2021/0076816 A1* | 3/2021 | DeShon | A47B 87/008 | |
| 2022/0133034 A1* | 5/2022 | Moyer | A47B 87/0284 | 312/108 |
| 2023/0128822 A1* | 4/2023 | Sy | F16B 7/18 | 211/26 |
| 2025/0072603 A1* | 3/2025 | Nelson | A47B 87/0292 | |

* cited by examiner

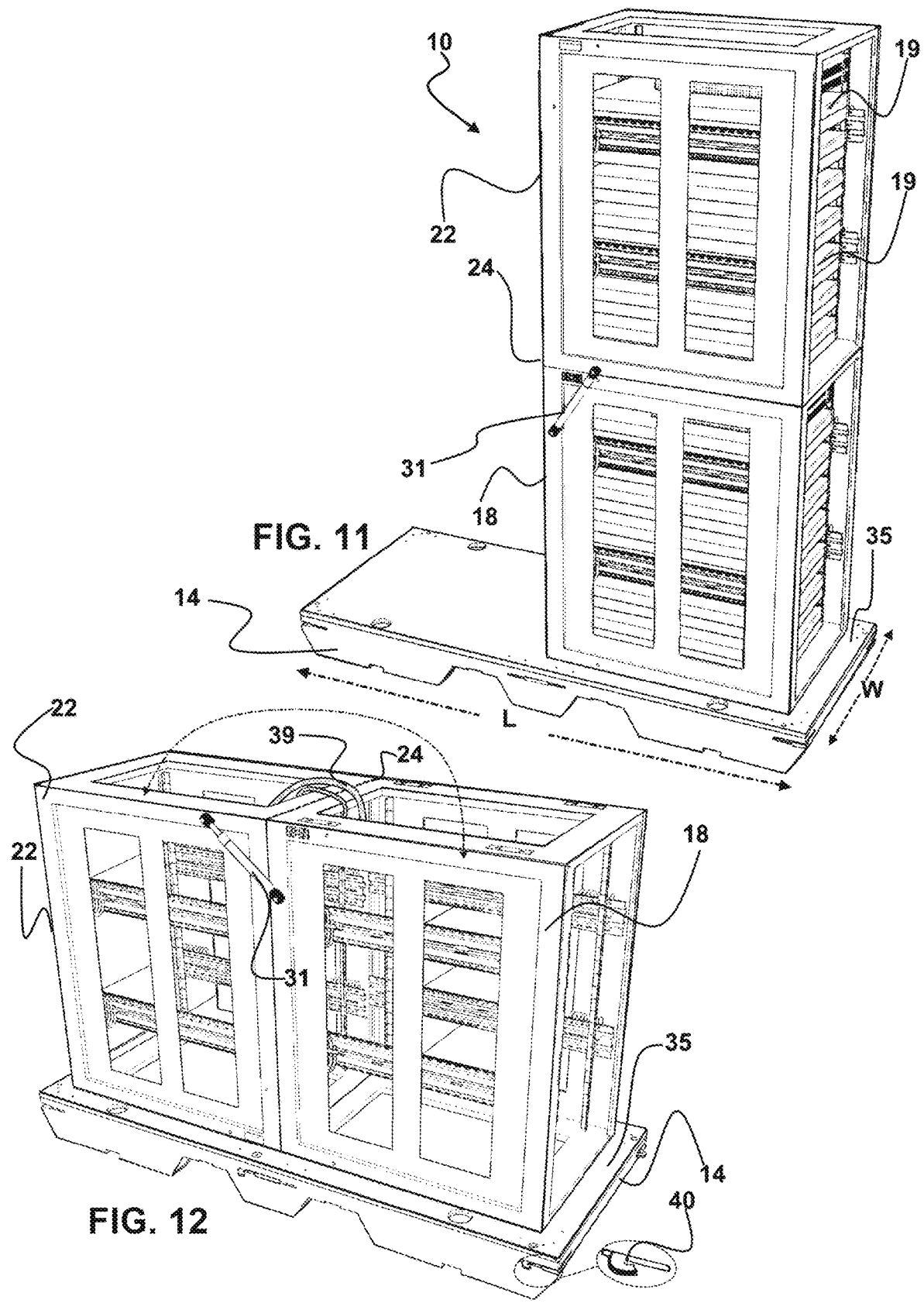

ELECTRONIC COMPONENT RACKING SYSTEM AND METHOD

This application claims priority to U.S. Provisional Patent Application Ser. No. 63/533,570 filed on Aug. 18, 2023.

BACKGROUND OF THE INVENTION

1. Field of the Invention

The present invention relates generally to rack systems employed for electronic equipment, such as computers, servers, video equipment, communications equipment and the like. More particularly, it relates to a rack system configured for engagement with multiple computers and other equipment which includes a pivotable upper rack portion and a supporting base adapted for both shipment and operation of the system during configuration and use.

2. Prior Art

In the shipping industry, air shipments have become the common means of transport of shipments requiring on time delivery in a matter of hours or days. Because of the issues involved in such shipments, weight balancing and especially-secure positioning in the aircraft hold are paramount. Further, because different air carriers can be involved in any one shipment within a country or internationally, industry standards, such as the unit load device (ULD) have been developed to standardize the pallets and freight carrying components used for such shipments.

Conventionally, a ULD is either an aircraft pallet and pallet net combination or an aircraft container. ULDs are removably positionable components which are subject to strict requirements for overall size and operation, both loaded and off the aircraft. An airworthy ULD must be structurally capable of restraining the loads and providing adequate protection to the aircraft systems and structure during flight.

A server rack is a standardized frame or enclosure for mounting multiple electronic equipment housings. A widely employed standard for server racks employs a distance between side supports of 19 inches. As such, electronic components, conventionally, are constructed in a manner where each module or electronic component housing has a front panel that is 19 inches wide. This 19 inch dimension includes protruding edges or ears from each side of the equipment housing which are positioned for removably engaging them to the rack frame with screws or bolts. Common mounted electronic components include computer servers, telecommunications equipment and networking hardware, audiovisual production gear, music production equipment, and scientific equipment. However, any electronic component that is rack-engageable is considered within the scope of this invention.

The forgoing examples of related art in the field of server racks and with ULD standardization and limitation related therewith are intended to be illustrative and not exclusive, and they do not imply any limitations on the racking system invention described and claimed herein. Various limitations of the related art will become apparent to those skilled in the art upon a reading and understanding of the specification below and the accompanying drawings.

SUMMARY OF THE INVENTION

The device herein disclosed and described provides significant enhancement to the art of configuration and shipping of data center racks and system. The disclosed rack device and method of employment thereof facilitates remote assembly, construction and testing of a server rack with required electronic components and cabling for a client or event. The device and method, thereafter, allow for subsequent shipping of a substantially operational racked system which is ready for use and already positioned on the conventional rack which is employed and expected worldwide.

The rack device and system herein has a first rack section or elevation which is operatively engaged to a support platform in a manner which secures the lower rack section to a section of the support platform. The support platform has a length and width which is configured to match ULD standardization requirements such that the rack device herein may be shipped with the rack device and electronic components engaged and the support platform atop a ULD support.

The rack device herein, in addition to the lower section which is attached to the support platform, includes an upper section which is positioned atop the lower section when the system is operational. The upper section of the rack is in a pivoting or hinged engagement to the lower section. This configuration is preferred in all modes of the rack device and system herein.

This pivoting engagement of the upper section to the lower section allows the rack system to be positioned in the deployed position with the lower section supporting the upper section during remote construction and configuration of the electronics to the rack. It also allows for the rack with configured electronic components and cabling to be placed in a retracted or shipping position to allow for shipment atop the support surface platform.

In the retracted position, the upper section is rotated upon the hinged or pivoting connection to the lower section whereupon a top surface of the upper rack contacts and is supported by the support surface platform. As can be surmised, the rack is much more compact in the retracted position allowing for easy shipment upon the ULD compliant support surface platform.

To add to the ease of shipment the support surface platform has engagement points upon a lower surface thereof which are adapted for removable engagement of both casters and shock absorbers. The support platform to that end has receiver slots for either the caster assemblies or the shock mount assemblies or isolators which are currently configured using a looped wire rope. The shock mount assembly is configured to be compatible and removably engageable to a standard IATA certified ULD pallet. The employment of the base or support platform configured to standard IATA ULD hardware allows for easy and quick shipping anywhere in the world.

This device and method of construction and shipping allows for power distribution data and signal cabling to be installed to the rack device and the system commissioned in one location which may be remote to the location for use thereof. Once assembled with the necessary electronic components and tested, the rack with assembled and engaged and operational electronic components may transported via air freight to be deployed in another location. The system, thus, exponentially decreases the time conventionally required to build a rack with assembled electronic components which are conventionally shipped to the location of use by allowing for advance configuration and assembly of a fully performing system on a conventional rack.

With respect to the above description, before explaining at least one preferred embodiment of the herein disclosed electronic component racking system and method invention in detail, it is to be understood that the invention is not limited in its application to the details of construction and to the arrangement of the components in the following description or illustrated in the drawings. The invention herein described is capable of other embodiments and of being practiced and carried out in various ways which will be obvious to those skilled in the art subsequent to their review of this disclosure. Also, it is to be understood that the phraseology and terminology employed herein are for the purpose of description and should not be regarded as limiting.

As such, those skilled in the art will appreciate that the conception upon which this disclosure is based may readily be utilized as a basis for designing of other structures, methods and systems for carrying out the several purposes of the present disclosed racking device and method. It is important, therefore, that the claims be regarded as including such equivalent construction and methodology insofar as they do not depart from the spirit and scope of the present invention.

As used in the claims to describe the various inventive aspects and embodiments, "comprising" means including, but not limited to, whatever follows the word "comprising". Thus, use of the term "comprising" indicates that the listed elements are required or mandatory, but that other elements are optional and may or may not be present. By "consisting of" is meant including, and limited to, whatever follows the phrase "consisting of". Thus, the phrase "consisting of" indicates that the listed elements are required or mandatory, and that no other elements may be present. By "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they affect the activity or action of the listed elements. Finally, the term "substantially" if not otherwise defined, means plus or minus ten percent.

It is an object of this invention to provide an electronics racking system which is collapsible from a deployed and operational configuration to a collapsed shipping configuration.

It is a further object of this invention to provide such an electronics racking system which has the rack engaged to a support platform which is configured to ULD standards to facilitate easy shipping of fully configured an operational electronics system pre engaged to the rack.

It is an other object of this invention to provide a customizable electronic racking system which is assemblable from multiple individual components having support platforms configured to be easily wheeled through interior doors of a building and assembled thereafter.

Other objects, features, and advantages of the present electronic rack system and method, as well as the advantages thereof over existing prior art, will become apparent from the description to follow, and are accomplished by the improvements described in this specification and hereinafter described in the following detailed description which fully discloses the invention, but should not be considered as placing limitations thereon.

BRIEF DESCRIPTION OF DRAWING FIGURES

The accompanying drawings, which are incorporated herein and form a part of the specification, illustrate some, but not the only or exclusive, examples of embodiments and/or features of the electronic component racking system herein. It is intended that the embodiments and figures disclosed herein are to be considered illustrative rather than limiting.

In the drawings:

FIG. 11 depicts a mode of the device and system herein showing a doorway pass-through configuration wherein the platform supporting the rack assembly is of a width configured to easily pass through building doorways showing the rack assembly in a deployed position.

FIG. 12 shows the device, as in FIG. 11, with the rack assembly in a lowered or retracted position for shipment and showing the cabling pre connected to the computing and electrical components mounted on the rack.

Figure 1:
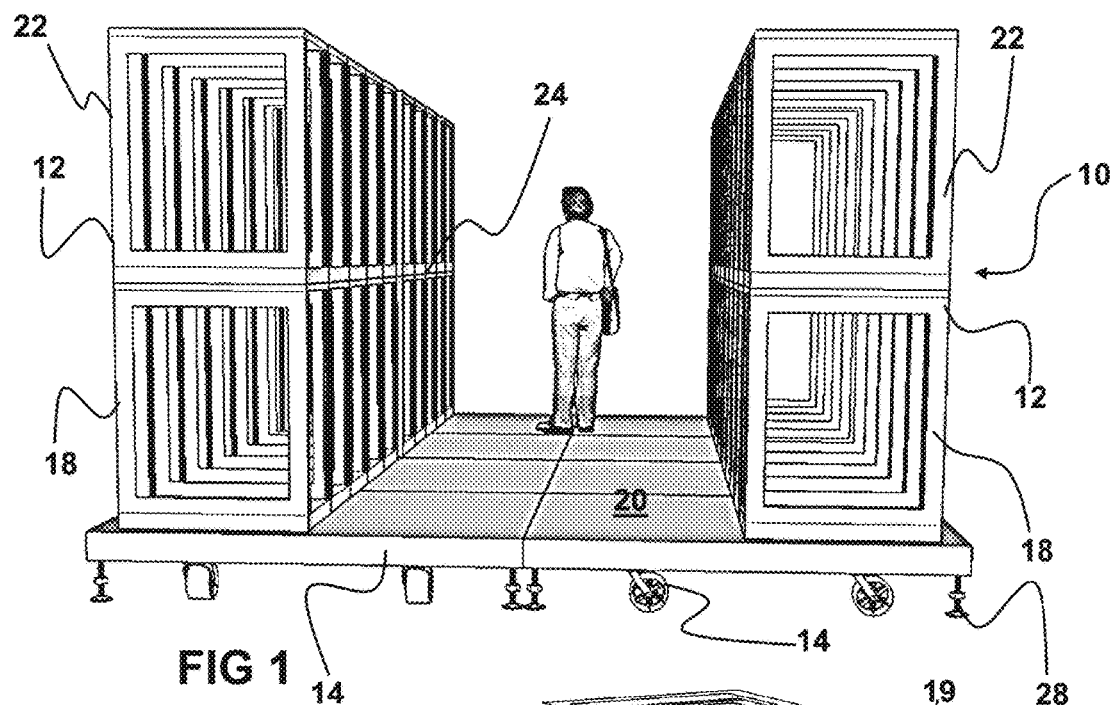
FIG. 1 shows two rack assemblies in deployed positions situated on separate support platforms which automatically form user walkways thereon upon configuration to the deployed position.

Other aspects of the present invention shall be more readily understood when considered in conjunction with the accompanying drawings, and the following detailed description, neither of which should be considered limiting.

DETAILED DESCRIPTION OF THE PREFERRED EMBODIMENTS OF THE INVENTION

In this description, the directional prepositions of up, upwardly, down, downwardly, front, back, top, upper, bottom, lower, left, right and other such terms refer to the device as it is oriented and appears in the drawings and are used for convenience only, and they are not intended to be limiting or to imply that the electronic racking device has to be used or positioned in any particular orientation.

Now referring to drawings in FIGS. 1-19, wherein similar components are identified by like reference numerals, there is seen in FIG. 1 the rack assembly system 10 herein. As shown, two individual rack assemblies 12 have been located to the deployed position thereof. As shown in FIG. 1 in the deployed position, each rack assembly 12 is engaged to a support platform 14. The top surface 16 of each support platform 14 is engaged to a bottom end of a lower rack section 18 adjacent one edge of the support platform 14. While not shown, this engagement of the lower rack section 18 may be by fasteners, such as screws or other well known conventional means for engaging a metal rack to a surface, such as the depicted support platform. With the rack assembly 12 rotated to the deployed position rotated atop the lower rack section 18, a portion of the top surface 16 of the support platform 14 is emptied and thereby forms a walkway 20 for users to access the electronic components 18 (FIG. 2) operatively mounted in the rack sections.

Figure 2:
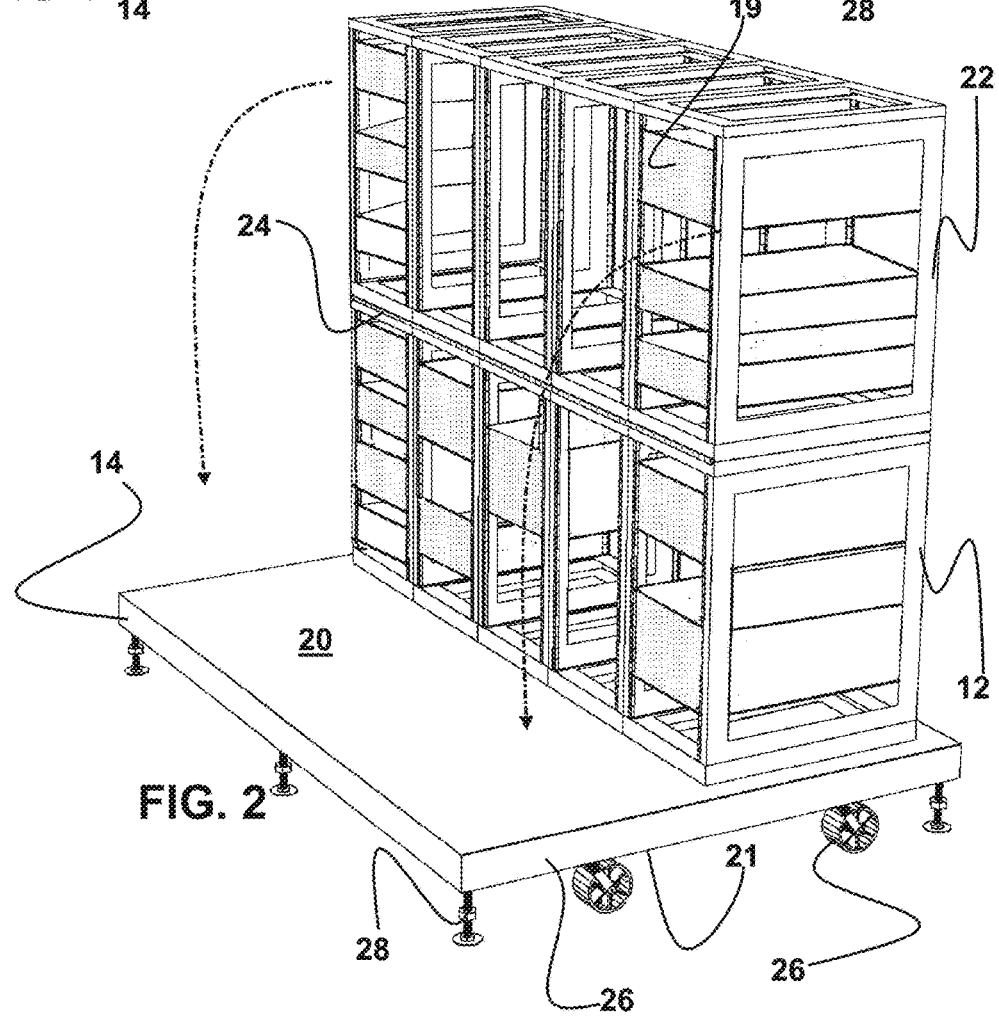
FIG. 2 depicts a rack assembly herein showing the upper rack section rotated to be supported atop the lower rack section and the formed walkway area.

In FIG. 2 is depicted a rack assembly 12 herein showing the upper rack section 22 rotated in a pivoting engagement 24 to a position atop the lower rack section 18 to a deployed position. As shown a lower end of the upper rack assembly 22 is supported atop an upper end of the lower rack section 18. As noted, this movement to the deployed position and off the top surface 16 of the platform, automatically defines a walkway area 20 of the top surface 16 of the support platform 14.

Also shown in FIG. 2 and other figures herein are a plurality of casters 26 which are preferably removably engaged with receivers 27 (FIG. 16) located on the lower surface 21 of the support platform 14. While they could be permanently mounted, it was found during experimentation, that removing the casters 26 allowed the platforms 14 to sit more stable during shipment.

Figure 8:
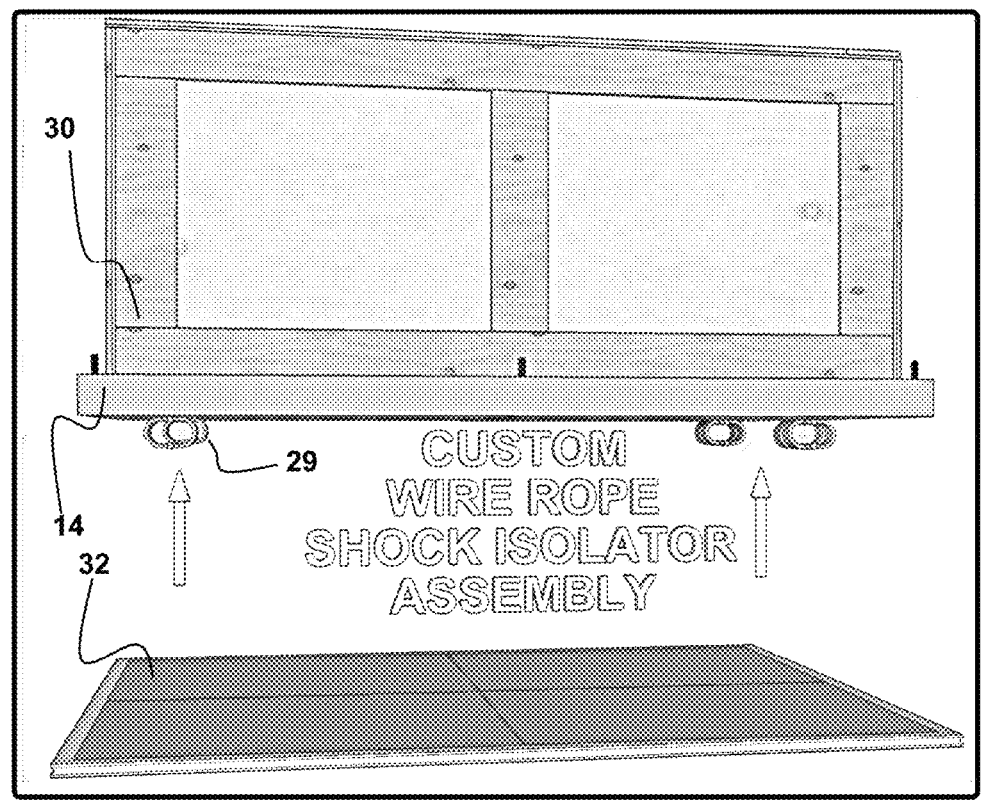
FIG. 8 shows the receivers on the lower surface of the support platform engaged with looped wire shock isolators once the casters have been removed therefrom.
Figure 9:
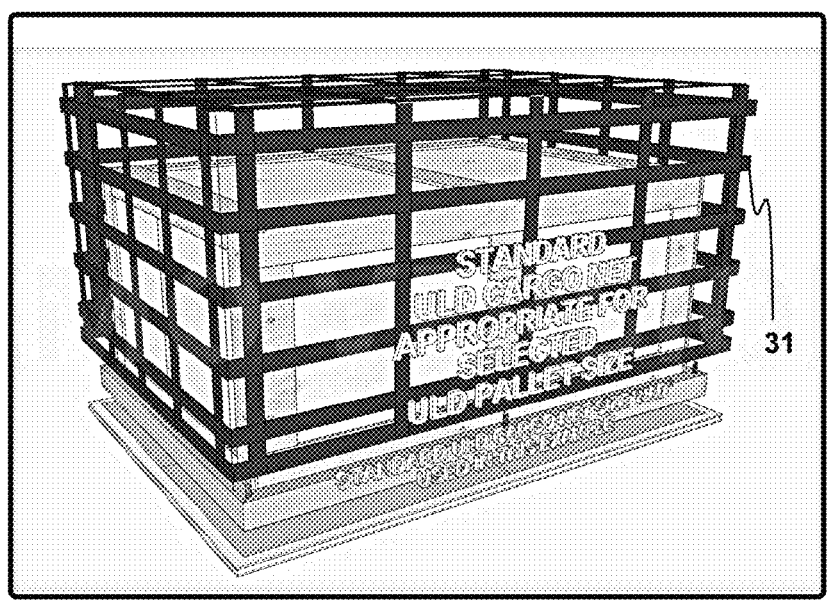
FIG. 9 depicts the rack assembly, as in FIG. 8, wherein a conventional ULD cargo net is engageable over the exterior of the cover which is sized for such engagement.

Additionally preferred in all modes of the system 10 herein are the positioning of screw jacks 28 extending from the lower surface 21 of the platforms 14. The screw jacks 28 allow users to raise and lower the support platform 14 from a floor or support surface to provide access to the receivers 27 in the lower surface 21 of the platform 14, wherein the casters 26 may be removed and replaced with shock isolators 29 for shipment (FIG. 8). The shock isolators 29 can engage in the receivers 27 and provide shock absorbing during shipment. The shock isolators 28 are formed as springs which will provide give to the platform 14 during shipping.

Figure 3:
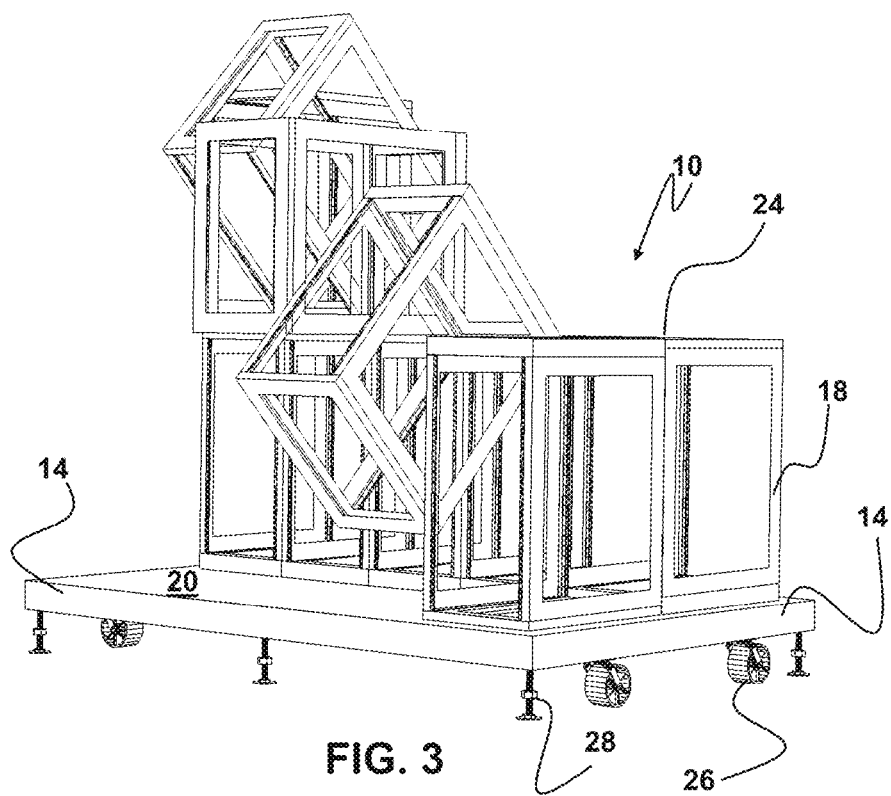
FIG. 3 shows the beginning of the process of moving the rack assembly from the deployed position of FIG. 2 to the retracted position of FIG. 5.
Figure 4:
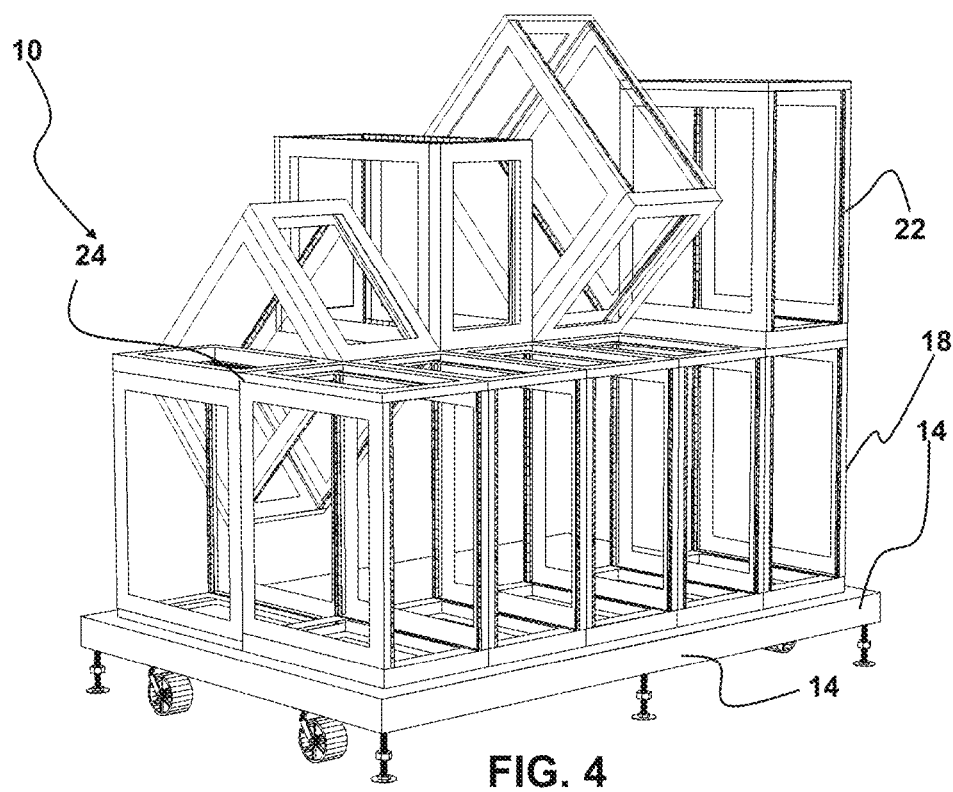
FIG. 4 shows a rear view of the rack assembly herein where portions of the upper section are being rotated to the retracted position of FIG. 5.
Figure 5:
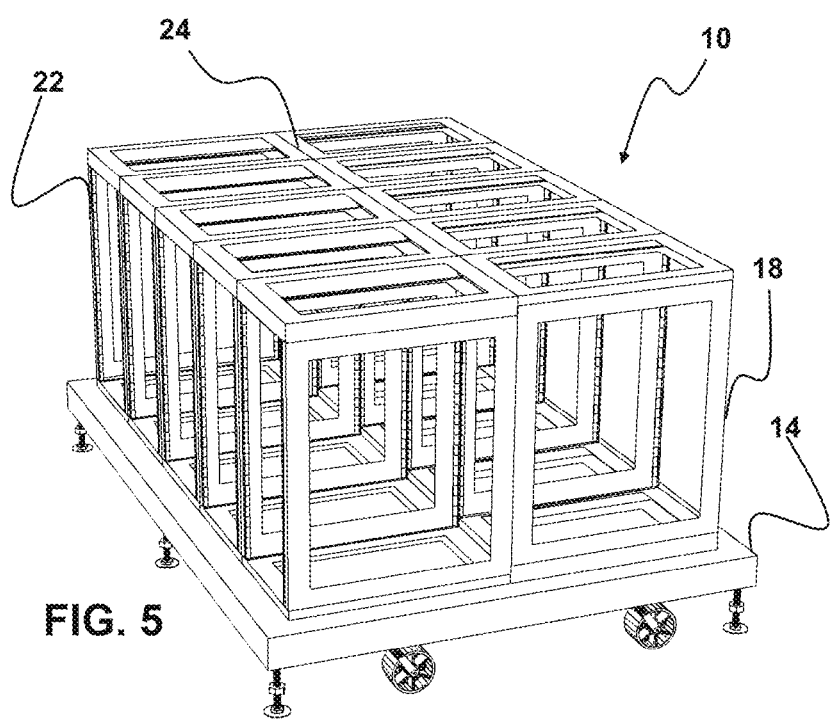
FIG. 5 depicts the rack assembly herein fully moved to the retracted position wherein the upper rack section has been fully rotated to place the assembly in the retracted position with the upper side of each segment of the upper rack section being supported by the support platform.

Depicted in FIG. 3-5 is the process of rotating the upper rack section 22, which may be formed in small metal segments which is preferred to minimize weight and minimize the force needed to rotate on the pivoting engagement 24. Of course, the upper rack section 22 can be formed of a single section with the appropriate industry standard spacing between uprights. Gas struts (FIGS. 11-12) may be engaged between the upper rack section 22 and lower rack section 18 to store energy when the upper rack section 22 is rotated to the retracted position locating it supported by the top surface 16 of the platform 14. This will allow the gas strut 31 to store the energy during rotation downward of the upper rack section 22 to be used subsequently to aid in lifting it atop the lower rack section 18 and is preferred to allow for easier deployment and stowage of the racks.

Figure 6:
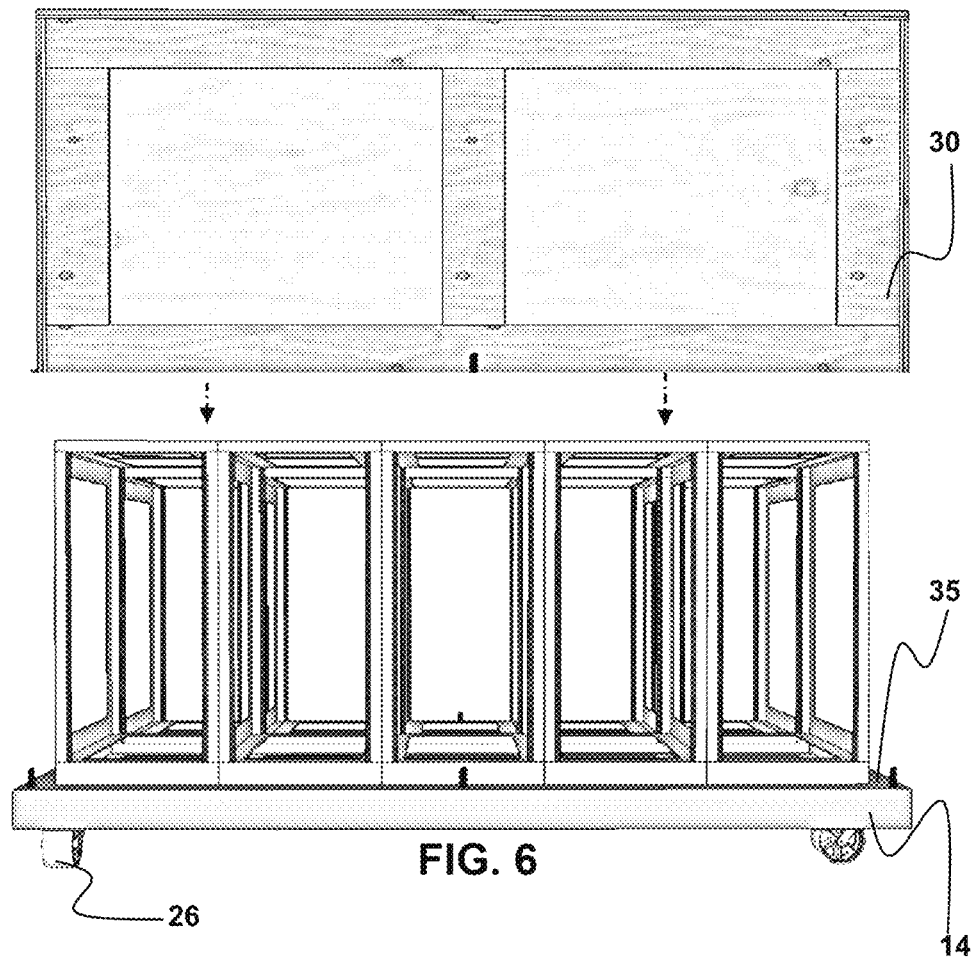
FIG. 6 shows the rack assembly, as in FIG. 5, wherein a cover is positionable there over to a contact and support upon the support platform.

The process of rotating the upper rack section 22 to the retracted position, shown in FIG. 6, is depicted in FIGS. 4-5 and is similar to that of FIGS. 11-12. As shown, segments forming the upper rack section 22 are rotated upon the pivoting engagement 24 to the lower rack section 18 to a position where the upper side of the upper rack section 22 contacts against the top surface 16 of the support platform 14. Shown in the retracted position of the rack assembly 12 in FIG. 6 and FIG. 12 a perimeter edge section 35 of the top surface 16 of the platform surrounds both the lower rack section 18 and the upper rack section 22. This is preferred to allow for easy positioning and engagement of the cover 30, as in FIGS. 6 and 9, to protect the system.

Figure 7:
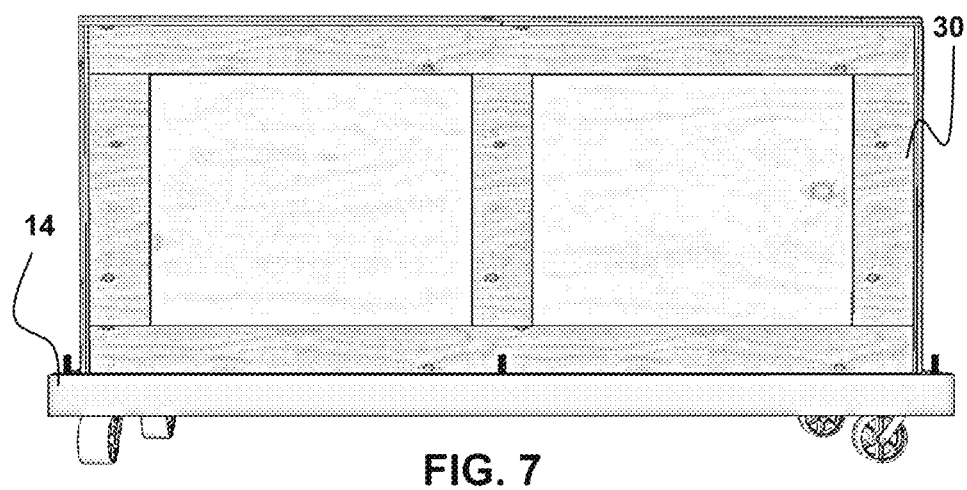
FIG. 7 depicts the rack assembly, as in FIG. 6, wherein the cover is engaged to the support platform.

In FIGS. 6-7 is shown the positioning of the cover 30 atop the perimeter edge of the support surface of the support platform 14. As can be seen, once the cover is secured to the support platform 14, it will protect both the rack assembly 12 as well and the operatively engaged and positioned electronic equipment 19. The cover 30 of FIGS. 6-7 is also employable with the device shown in FIG. 12 to protect the electronic components and the rack device 10 during shipment.

At this juncture. the screw jacks 28 may rotate to raise the platform 14, and the casters 26 may be removed from the receivers 27 positioned on the lower surface 21 of the support platform 14 and then replaced with shock isolators 29. The shock isolators 29 are configured to provide both vertical and horizontal shock absorption during transport. By shock isolators 29 herein is meant a spring like component, as shown in FIG. 8, or any other shock isolating component, such as hydraulic shocks which will aid in blocking jarring movements during movement.

With the shock isolators 29 engaged to the support platform 14, the cover 30 engaged, may be positioned atop a conventional ULD pallet 32. A ULD cargo net 31 may be engaged over the cover 30, and thereafter, the pallet 32 is positionable within an aircraft in a conventional fashion.

Figure 10:
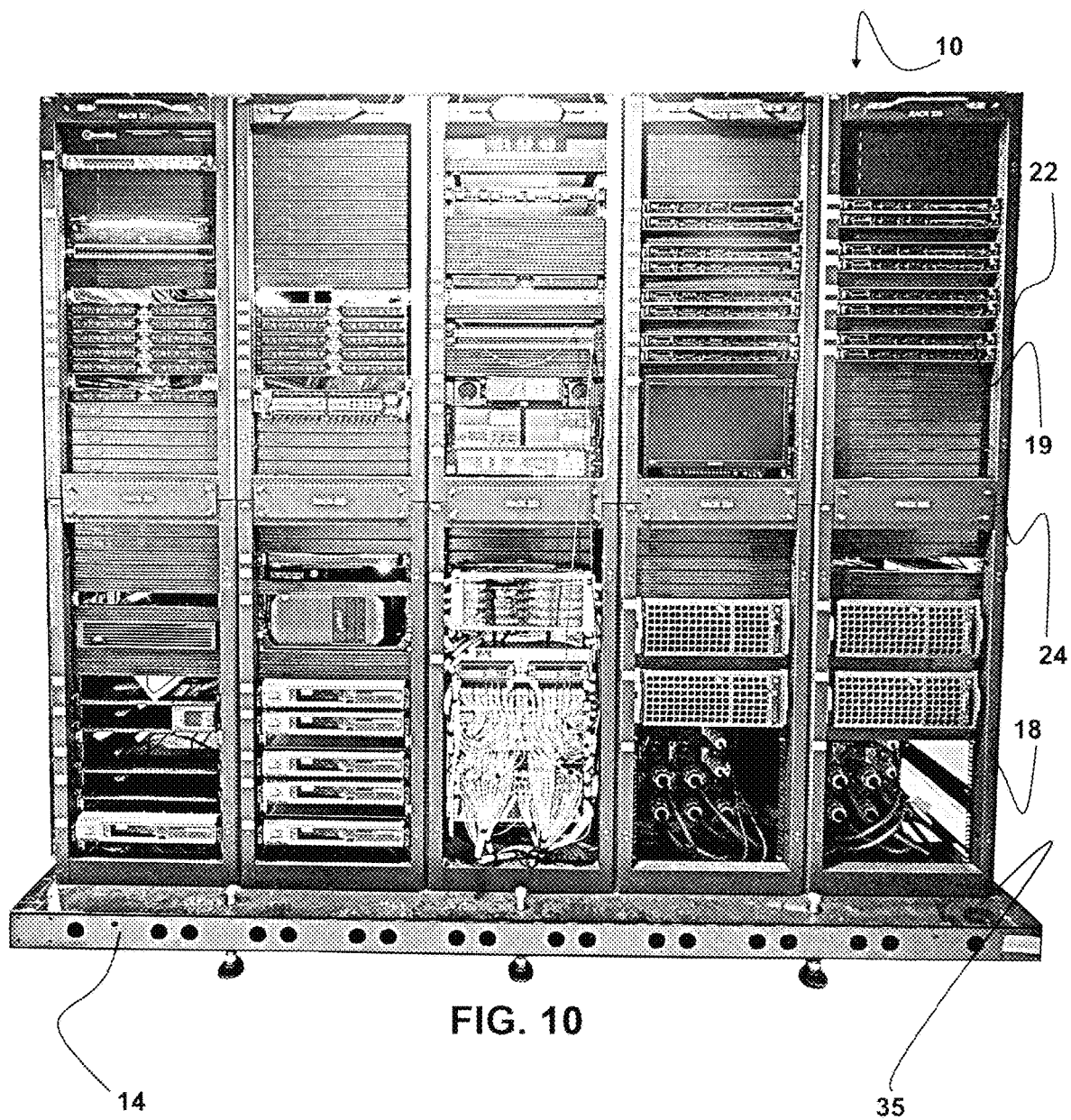
FIG. 10 shows the rack assembly herein in an assembled and deployed configuration, showing the electronic components operatively engaged in formed bays and the pre-wiring of the system so mounted.

Shown in FIG. 10 is the rack assembly 12 herein in an assembled and deployed configuration. The electronic components 19 having been operatively engaged to both the rack assembly 12 and to each other to form a fully operational electronic system, prior to shipment, thereby provides the electronic system configured for the purpose intended. For example, television networks can have an entire audio and video and communication system preassembled on the deployed rack assembly 12 and tested for full functioning prior to use. Thereafter, the rack assembly 12 and operatively engaged and connected electronic components 19 can be shipped to and from venues requiring it. By electronic components herein is meant, any computer, server, video processor, sound processor, radio or optical transmitter, or any other electronic component 19 which is or may be conventionally mounted in a rack, such as racks having a 19 inch opening adapted for such.

FIG. 11 depicts a mode of the rack assembly system 10 showing a doorway pass-through configuration. In this configuration of the rack assembly system 10, the platform 14 supporting the rack assembly, formed by the lower rack section 18 in the pivoting engagement 24 with the upper rack section 22, is of a width W configured to easily pass through building doorways. Currently, this width W is between 30-38 inches, with a current preferred width W of 34 inches which has been shown to work well with both U.S. and foreign indoor doorways. Also shown is a preferred length L of the platform 14 which is currently between 81-88 inches with a current particularly preferred length W of 86 inches. This combination with the preferred width W has shown to work especially well for shipping and subsequent transport through building doorways and hallways and turns therein. The gas strut 31 is also shown in a retracted position.

FIG. 12 shows the device, as in FIG. 11, with the rack assembly system 10 in a lowered or retracted position supported atop the platform 14 and ready for shipment and a positioning of the cover 30, such as in FIG. 8, atop the perimeter 35 of the top surface 16 surrounding the rack assembly system 10. Also shown is the configuration of the system 10 to allow for the communication and engagement of cables 39 between the electronic components 19 mounted in the rack assembly system 10. As noted, this allows for an entire system, such as that for television broadcasting, to be assembled with the electronic components 19 mounted in the upper rack section 18 and lower rack section 22 and operatively engaged with cables 39 to each other so the assembled electronic system is ready to operate on arrival once the racks are deployed.

Figure 13:
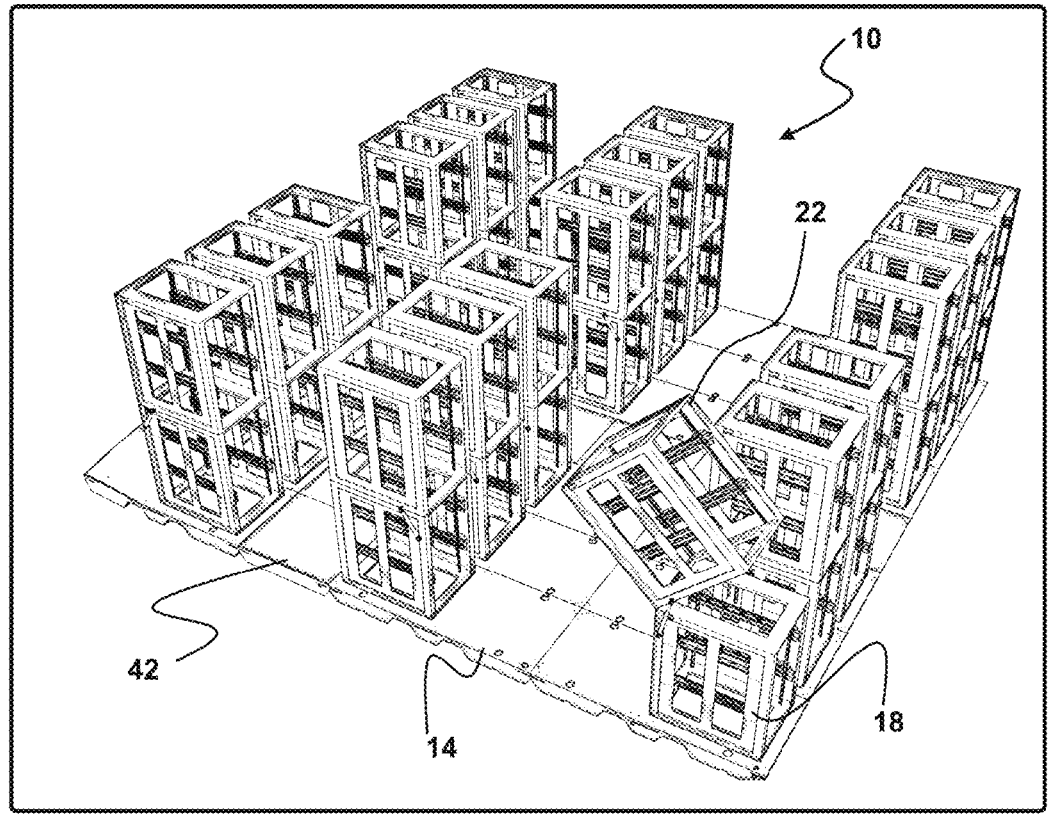
FIG. 13 shows a computer or control room assembled from a plurality of the device, as shown in FIG. 11-12, wherein the platforms have been removably engaged using onboard interlocking connectors.
Figure 14:
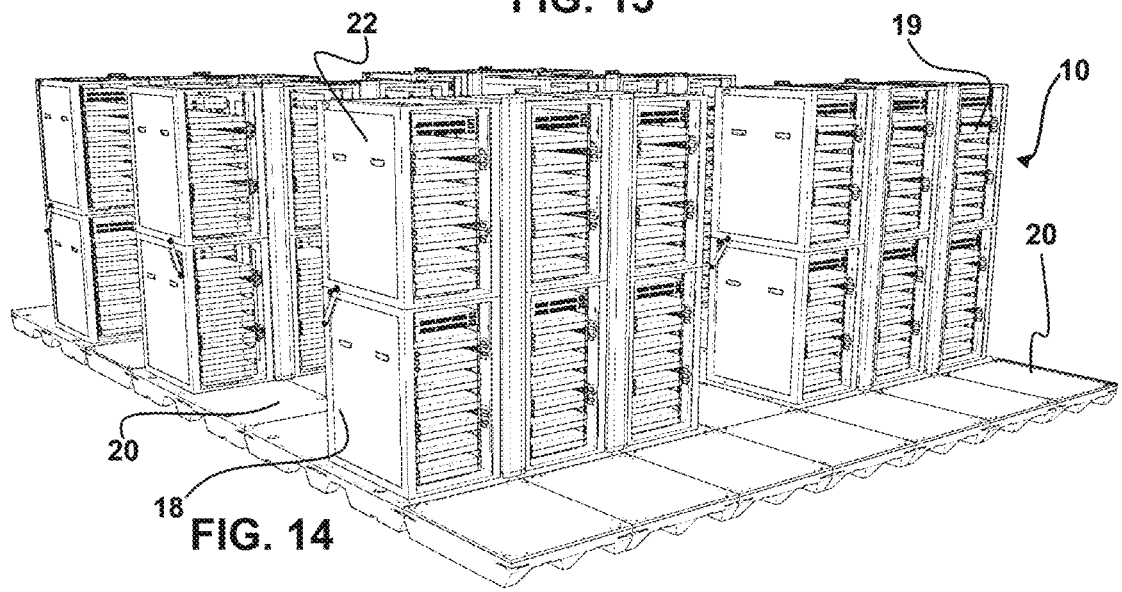
FIG. 14 shows the rack assembly herein in an assembled and deployed configuration, showing the electronic components operatively engaged in formed bays and the pre-wiring of the system so mounted.
Figure 18:
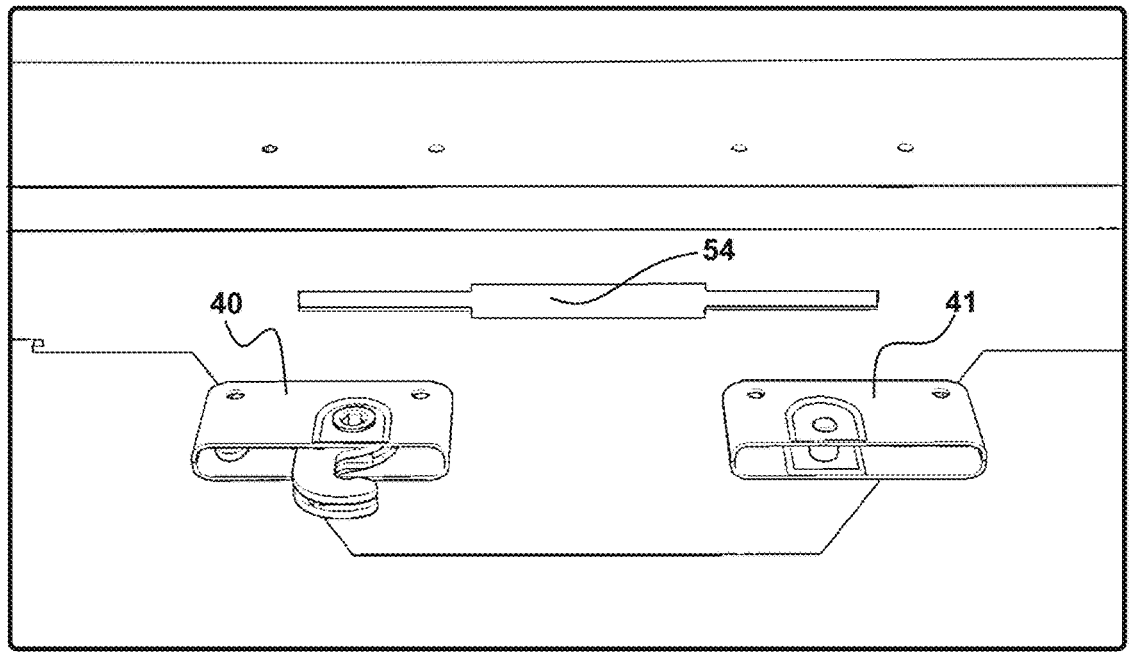
FIG. 18 depicts the engageable connectors positioned in a middle area on each side of a platform to allow engagement of multiple platforms with racks thereon, as shown in FIGS. 13-14.
Figure 19:
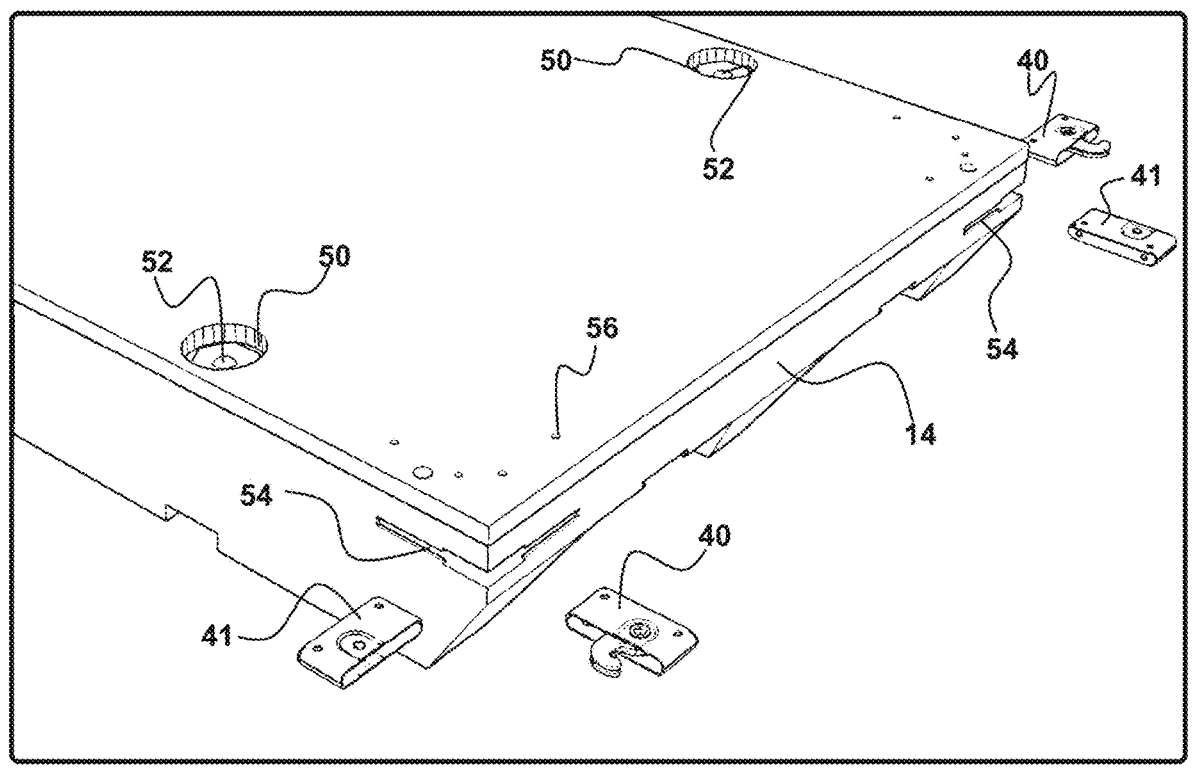
FIG. 19 shows the connectors positioned at corners of the platform to allow removable engagement to adjacent platforms having complimentary connectors.

Shown in FIGS. 13-14 are examples of an electronic control room which may be deployed where electronic components 19 are pre positioned and operatively engaged with a plurality of the rack assemblies. Also shown is the engagement of the plurality of platforms 14 to each other to form an enlarged support surface using interlocking connectors 40 which will engage with mating connectors 41 on an adjacent platform 14 (FIGS. 18-19). The interlocking connectors 40 are preferably placed on one edge of each corner of the platform 14 with the mating connectors 41 located on the opposite corner edge. Also, preferably, the interlocking connectors 40 and mating connectors 41 are positioned at a mid point along the length L of the platforms 14, such as shown in FIG. 18. Thus, from a plurality of platforms 14 having a rack assembly thereon, a large support platform 42 may be formed by engaging interlocking connectors 40 with mating connectors 41 on adjacent platforms 14.

Figure 15:
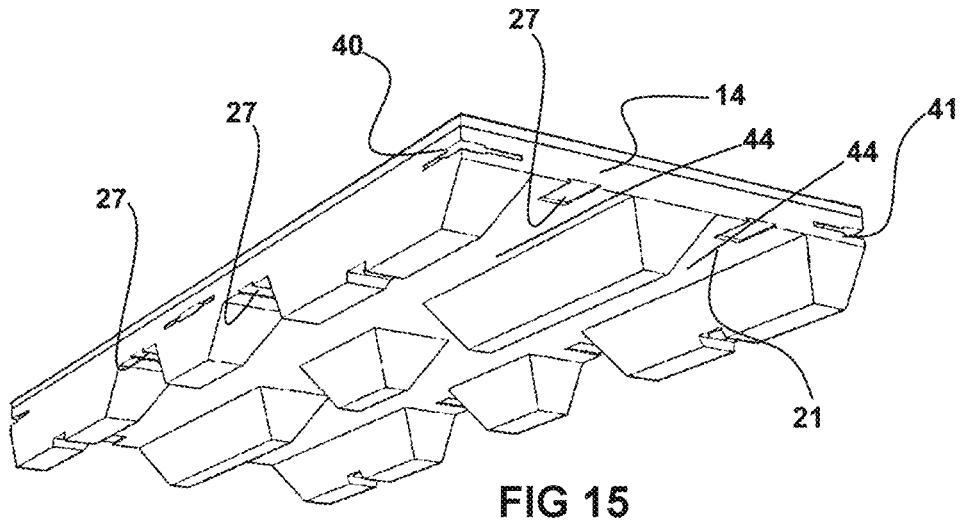
FIG. 15 is a lower side view of the doorway passable support platform for a rack which has multiple passages for use of a forklift.
Figure 16:
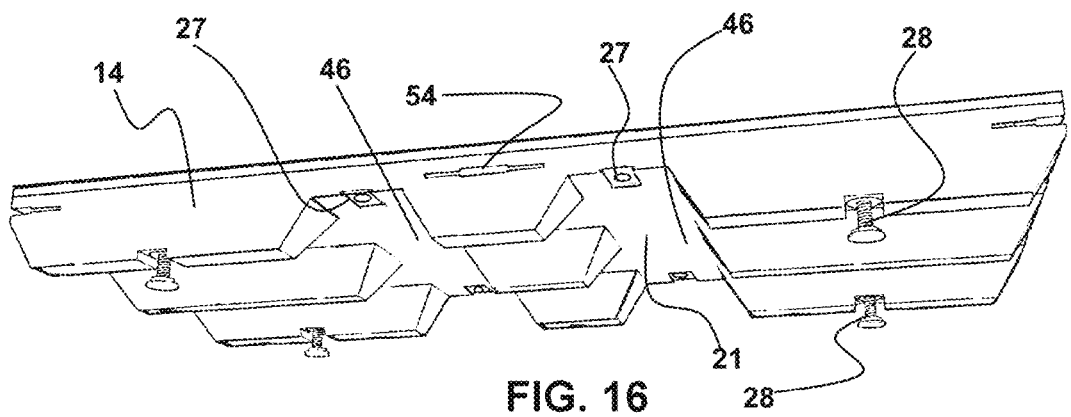
FIG. 16 shows the adjustable feet which may be raised to level the platform as well as for elevating it a sufficient height to engage casters thereunder in wheel engagement slots.

Shown in FIGS. 15-16 are a bottom view of a platform, as in FIGS. 11-14. As can be seen, the three receivers 27 are present for removable engagement of either the casters 26 or the shock isolators 29 therein. Also shown are a first pathways 44 running along the length of the platform and second pathways 46 running along with width thereof, which are sized for pallet jack forks to be positioned therein. Additionally shown in FIG. 16 shows the adjustable feet of the screw jacks 28 which may be used to level the platform as well as to elevate it a sufficient height to allow for engagement of the casters 26 into the receivers 27 or the shock isolators 29 therein.

Figure 17:
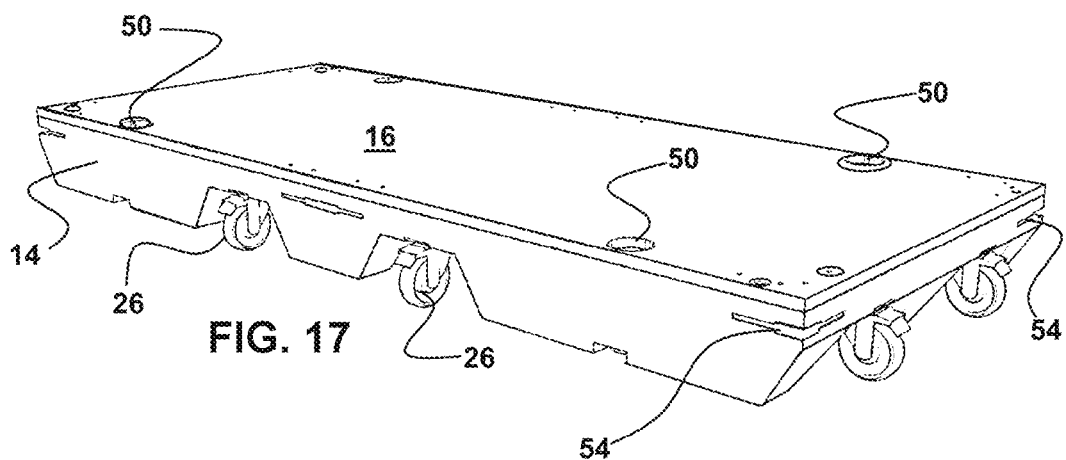
FIG. 17 shows a top view of the platform of FIGS. 15-16 which has casters engaged for easy rolling through interior building doorways to a destination.

In FIG. 17 is depicted a top view of the platform of FIGS. 12-16 showing the casters 26 engaged with the receivers 27. Also shown are the access openings 50 through which the projection of the screw jacks 28 from the lower surface 21 can be adjusted. An adjustment connector 52 (FIG. 19,) such as an allen wrench recess or a hex head engaged to the screw jacks 28 is accessible through the access openings for this adjustment.

In FIGS. 18-19 is shown the engageable connectors, such as the interlocking connector 40 and mating connector 41 prior to insertion to a mount within connector cavities 54. The interlocking connector 40 and mating connector 41 may be permanently positioned within the connector cavities 54 or slid to a frictional and removable engagement therein. The interlocking connecter 40 may be actuated to engage or disengage a mating connector 41 on an adjacent support platform 14 through the connector opening 56 using an actuation tool, such as an allen wrench, screw driver, or other actuation tool to which the interlocking connector 40 is configured to engage and which will actuate the interlocking connector 40 to engage or disengage with a mating connecter 41.

It should be noted and anticipated that although the electronic equipment racking system is shown in its most simple form, various components and aspects of the device may be differently shaped or slightly modified when forming the invention herein. As such those skilled in the art will appreciate the descriptions and depictions set forth in this disclosure are meant to portray examples of preferred modes of the electronic equipment racking system within the overall scope and intent of the invention, and are not to be considered limiting.

As such, while all of the fundamental characteristics and features of the electronic racking system invention have been shown and described herein, with reference to particular embodiments thereof, a latitude of modification, various changes and substitutions are intended in the foregoing disclosure as well as the claims which follow, and it will be apparent that in some instances, some features of the invention may be employed without a corresponding use of other features without departing from the scope of the invention as set forth. It should also be understood that various substitutions, modifications, and equivalent variations may be made by those skilled in the art without departing from the spirit or scope of the invention. Consequently, all such modifications and equivalent variations and substitutions as would occur to those skilled in the art subsequent to their review of this specification, are included within the scope of the invention as defined by the following claims.

What is claimed is:

1. A racking system for electronic equipment comprising:
a platform having a top surface opposite a bottom surface;
an electronics rack having a lower rack section and an upper rack section;
said lower rack section having a lower opening therein for engaging electronic equipment therein;
said upper rack section having an upper opening therein for engaging said electronic equipment therein;
said lower rack section positioned atop a first surface area of said top surface of said platform;
said upper rack section in a pivoting engagement with said lower rack section;
said upper rack section having a retracted position wherein a top side of said upper rack section is positioned atop a second surface area of said top surface which is adjacent said first surface area;

said upper rack section having a deployed position wherein a bottom side thereof, opposite said topside, is positioned atop a top side of said lower rack section; and said upper rack section being pivotable between said retracted position and said deployed position, whereby said electronic is mountable into an upper opening of said upper rack section and said lower opening of said lower rack section to pre-configure it for use once said upper rack section has been pivoted to said deployed position.

2. The racking system for electronic equipment of claim 1, wherein said second surface area of said top surface of said platform comprises a walkway providing access to said electronic equipment with said upper rack section in said deployed position.

3. The racking system for electronic equipment of claim 1, additionally comprising:
a perimeter edge of said top surface surrounding said first surface area of said top surface of said platform and said second surface area of said top surface of said platform while said upper rack section is positioned thereon in said retracted position;
a cover, said cover having an opening communicating with a cavity therein, said opening having an edge surrounding it; and
said edge of said opening positionable upon said perimeter edge of said top surface to form a cover for said lower rack section and said upper rack section while in said retracted position.

4. The racking system for electronic equipment of claim 1, wherein said platform has a width between 30-38 inches whereby said width allows communication of said platform through interior doors of a building.

5. The racking system for electronic equipment of claim 2, wherein said platform has a width between 30-38 inches whereby said width allows communication of said platform through interior doors of a building.

6. The racking system for electronic equipment of claim 1, additionally comprising:
interlocking connectors positioned within connector cavities positioned on side surfaces surrounding said top surface of said platform;
mating connectors positioned in mating connector cavities positioned on said side surfaces surrounding said top surface of said platform;
a plurality of said platforms each having a said electronics rack thereon; and
said mating connectors engageable with said mating connectors whereby said plurality of said platforms form a single support platform having a plurality of said electronics racks thereon.

7. The racking system for electronic equipment of claim 2, additionally comprising:
interlocking connectors positioned within connector cavities positioned on side surfaces surrounding said top surface of said platform;
mating connectors positioned in mating connector cavities positioned on said side surfaces surrounding said top surface of said platform;
a plurality of said platforms each having a said electronics rack thereon; and
said mating connectors engageable with said mating connectors whereby said plurality of said platforms form a single support platform having a plurality of said electronics racks thereon.

8. The racking system for electronic equipment of claim 3, additionally comprising:
interlocking connectors positioned within connector cavities positioned on side surfaces surrounding said top surface of said platform;
mating connectors positioned in mating connector cavities positioned on said side surfaces surrounding said top surface of said platform;
a plurality of said platforms each having a said electronics rack thereon; and
said mating connectors engageable with said mating connectors whereby said plurality of said platforms form a single support platform having a plurality of said electronics racks thereon.

9. The racking system for electronic equipment of claim 4, additionally comprising:
interlocking connectors positioned within connector cavities positioned on side surfaces surrounding said top surface of said platform;
mating connectors positioned in mating connector cavities positioned on said side surfaces surrounding said top surface of said platform;
a plurality of said platforms each having a said electronics rack thereon; and
said mating connectors engageable with said mating connectors whereby said plurality of said platforms form a single support platform having a plurality of said electronics racks thereon.

10. The racking system for electronic equipment of claim 5, additionally comprising:
interlocking connectors positioned within connector cavities positioned on side surfaces surrounding said top surface of said platform;
mating connectors positioned in mating connector cavities positioned on said side surfaces surrounding said top surface of said platform;
a plurality of said platforms each having a said electronics rack thereon; and
said mating connectors engageable with said mating connectors whereby said plurality of said platforms form a single support platform having a plurality of said electronics racks thereon.

11. The racking system for electronic equipment of claim 1 additionally comprising:
a gas strut engaged at a first end to said upper rack section;
said gas strut engaged at a second end thereof to said lower rack section; and
said gas strut for storing energy when said upper rack section is moved to said retracted position whereby said energy, so stored, reduces the effort to pivot said upper rack section from said retracted position to said deployed position.

12. The racking system for electronic equipment of claim 2 additionally comprising:
a gas strut engaged at a first end to said upper rack section;
said gas strut engaged at a second end thereof to said lower rack section; and
said gas strut for storing energy when said upper rack section is moved to said retracted position whereby said energy, so stored, reduces the effort to pivot said upper rack section from said retracted position to said deployed position.

13. The racking system for electronic equipment of claim 5 additionally comprising:
a gas strut engaged at a first end to said upper rack section;
said gas strut engaged at a second end thereof to said lower rack section; and said gas strut for storing energy when said upper rack section is moved to said retracted position whereby said energy, so stored, reduces the effort to pivot said upper rack section from said retracted position to said deployed position.

14. The racking system for electronic equipment of claim 6 additionally comprising:
a gas strut engaged at a first end to said upper rack section;
said gas strut engaged at a second end thereof to said lower rack section; and
said gas strut for storing energy when said upper rack section is moved to said retracted position whereby said energy, so stored, reduces the effort to pivot said upper rack section from said retracted position to said deployed position.

15. The racking system for electronic equipment of claim 7 additionally comprising:
a gas strut engaged at a first end to said upper rack section;
said gas strut engaged at a second end thereof to said lower rack section; and
said gas strut for storing energy when said upper rack section is moved to said retracted position whereby said energy, so stored, reduces the effort to pivot said upper rack section from said retracted position to said deployed position.

* * * * *